United States Patent
Hou et al.

(10) Patent No.: US 9,653,378 B2
(45) Date of Patent: May 16, 2017

(54) HEAT DISSIPATION SOLUTION FOR ADVANCED CHIP PACKAGES

(71) Applicant: National Center for Advanced Packaging Co., Ltd., Wuxi, Jiangsu (CN)

(72) Inventors: Fengze Hou, Beijing (CN); Tingyu Lin, Bukit Batok Central (SG)

(73) Assignee: National Center for Advanced Packaging Co., Ltd., Wuxi (CN)

( * ) Notice: Subject to any disclaimer, the term of this patent is extended or adjusted under 35 U.S.C. 154(b) by 0 days.

(21) Appl. No.: 14/703,476

(22) Filed: May 4, 2015

(65) Prior Publication Data
US 2016/0037680 A1    Feb. 4, 2016

(30) Foreign Application Priority Data

Aug. 4, 2014 (CN) .......................... 2014 1 0380524
Aug. 4, 2014 (CN) .......................... 2014 1 0380771
Aug. 4, 2014 (CN) .......................... 2014 1 0380772
Aug. 4, 2014 (CN) .......................... 2014 1 0380797

(51) Int. Cl.
*H01L 23/473*    (2006.01)
*H05K 7/20*    (2006.01)

(52) U.S. Cl.
CPC ........ *H01L 23/473* (2013.01); *H01L 23/4735* (2013.01); *H05K 7/20345* (2013.01); *H01L 2224/16225* (2013.01); *H01L 2224/32225* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2924/15311* (2013.01); *H01L 2924/181* (2013.01)

(58) Field of Classification Search
CPC .................................................. H01L 23/4735
See application file for complete search history.

(56) References Cited

U.S. PATENT DOCUMENTS

| | | | | |
|---|---|---|---|---|
| 5,309,319 | A * | 5/1994 | Messina | H01L 23/4336 165/142 |
| 5,349,831 | A * | 9/1994 | Daikoku | H01L 23/427 165/80.4 |
| 5,763,951 | A * | 6/1998 | Hamilton | H01L 23/473 257/706 |
| 6,550,263 | B2 * | 4/2003 | Patel | H01L 23/4735 165/80.4 |
| 6,650,542 | B1 * | 11/2003 | Chrysler | H01L 23/4735 165/104.33 |
| 6,952,346 | B2 * | 10/2005 | Tilton | H05K 7/20345 165/80.4 |

(Continued)

*Primary Examiner* — Robert J Hoffberg
(74) *Attorney, Agent, or Firm* — Zareefa B. Flener; Flener IP Law

(57) ABSTRACT

A solution for dissipating heat generated from high power chip packages, e.g., a fcBGA package, wbBGA package, 2.5D/3D TSV package, PoP, etc. The heat dissipation system may include a high power chip package including a high power chip. A micro-jet may be attached to the high power chip. A micro-pump may be in fluidic communication with the micro-jet. A heat exchanger may be in fluidic communication with the micro-pump. The high power chip package is assembled on the same PCB with the micro-pump and the heat exchanger.

14 Claims, 7 Drawing Sheets

(56) References Cited

U.S. PATENT DOCUMENTS

| | | | | |
|---|---|---|---|---|
| 6,986,382 B2* | 1/2006 | Upadhya | F04B 19/006 | 165/104.21 |
| 6,988,534 B2* | 1/2006 | Kenny | F04B 17/00 | 165/104.21 |
| 7,000,684 B2* | 2/2006 | Kenny | F04B 17/00 | 165/104.21 |
| 7,104,312 B2* | 9/2006 | Goodson | F04B 19/006 | 165/104.33 |
| 7,114,550 B2* | 10/2006 | Nakahama | F28F 3/12 | 165/104.33 |
| 7,277,283 B2* | 10/2007 | Campbell | H01L 23/4735 | 165/80.4 |
| 7,284,389 B2* | 10/2007 | Sharma | H01L 23/4735 | 257/E23.1 |
| 7,362,574 B2* | 4/2008 | Campbell | H01L 23/4735 | 165/104.33 |
| 7,375,962 B2* | 5/2008 | Campbell | H01L 23/4735 | 165/104.33 |
| 7,511,957 B2* | 3/2009 | Campbell | F28C 3/08 | 165/80.4 |
| 7,549,298 B2* | 6/2009 | Bash | F28D 5/00 | 62/121 |
| 7,787,248 B2* | 8/2010 | Campbell | H01L 23/427 | 165/104.33 |
| 7,808,780 B2* | 10/2010 | Brunschwiler | G06F 1/20 | 165/104.33 |
| 7,885,074 B2* | 2/2011 | Campbell | H01L 23/427 | 165/104.33 |
| 7,948,757 B2* | 5/2011 | Campbell | H01L 23/427 | 165/104.33 |
| 7,992,627 B2* | 8/2011 | Bezama | H01L 23/4735 | 165/80.4 |
| 8,004,832 B2* | 8/2011 | Brunschwiler | G06F 1/20 | 165/104.33 |
| 8,107,234 B2* | 1/2012 | Brunschwiler | G06F 1/20 | 165/104.33 |
| 8,169,779 B2* | 5/2012 | Le | H01L 23/4735 | 165/104.33 |
| 8,730,673 B2* | 5/2014 | Vos | H01L 23/427 | 257/686 |
| 8,944,151 B2* | 2/2015 | Flotta | H01L 23/4735 | 165/104.21 |
| 9,247,672 B2* | 1/2016 | Mehring | H05K 7/20 | |
| 9,559,037 B2* | 1/2017 | Eid et al. | H01L 23/467 | |
| 2005/0211418 A1* | 9/2005 | Kenny | F04B 17/00 | 165/80.4 |
| 2008/0002363 A1* | 1/2008 | Campbell | H01L 23/4735 | 361/699 |
| 2008/0278913 A1* | 11/2008 | Campbell | F28C 3/08 | 361/699 |
| 2012/0160459 A1* | 6/2012 | Flotta | H01L 23/4735 | 165/104.27 |
| 2012/0300402 A1* | 11/2012 | Vos | H01L 23/427 | 361/701 |
| 2014/0340848 A1* | 11/2014 | Vos | H01L 23/427 | 361/701 |
| 2015/0208555 A1* | 7/2015 | Flotta | H01L 23/4735 | 361/679.47 |

* cited by examiner

HEAT DISSIPATION SOLUTION FOR ADVANCED CHIP PACKAGES

RELATED APPLICATIONS

This application claims the benefit of Chinese Application Serial Nos. 201410380524.8, 201410380771.8, 201410380772.2, and 201410380797.2, filed Aug. 4, 2014. All four of these applications are incorporated herein by reference in their entireties.

TECHNICAL FIELD

Embodiments of the present invention relate generally to a heat dissipation structure for flip chip ball grid array ("fcBGA") packages, wire bond ball grid array ("wbBGA"), package on package ("PoP"), 2.5D/3D through silicon via ("TSV") packages, etc.

BACKGROUND

In a high power chip, especially chips having a heat flux of over 350 W/cm$^2$, or chips having hot spots of more than 10 KW/cm$^2$, it may be difficult to dissipate heat generated by the chip from the package, especially if the chip is packaged in the form of a ball grid array ("BGA").

SUMMARY

In an aspect, embodiments of the invention relate to a heat dissipation system for chip packages including a high power chip package. A built-in micro-jet in the high power chip package is attached to the high power chip. A micro-pump is in fluidic communication with the micro-jet. A heat exchanger is in fluidic communication with the micro-pump.

One or more of the following features may be included. The high power chip package may be a fcBGA package, a wbBGA package, a 2.5D/3D TSV package, or a PoP. The micro jet may be attached to a surface of the high power chip.

The micro-jet may define a micro jet chamber having an inlet and an outlet. The inlet may be in fluidic communication with the micro-pump. The outlet may be in fluidic communication with the heat exchanger.

The high power chip package, micro-pump, the heat exchanger may be disposed on a single printed circuit board "PCB."

The high power chip may be encapsulated in a mold compound. The mold compound may cover the micro-jet. At least a portion of a surface of the micro jet may be exposed by the mold compound.

The micro jet may define a micro jet chamber, and a separator may be disposed in the micro jet chamber. The separator may define a plurality of vias.

The high power chip may be disposed on an organic substrate.

BRIEF DESCRIPTION OF THE DRAWINGS

FIG. 1A illustrates the micro-jet covered by mold compound. FIG. 1B and FIG. 1C illustrate the top surfaces of the micro jet exposed outside the fcBGA.

FIG. 7A illustrates the micro-jet covered by mold compound. FIG. 7B and FIG. 7C illustrate the top surfaces of the micro-jet exposed outside of the 2.5D/3D TSV package.

DETAILED DESCRIPTION

Embodiments of the invention provide a solution for dissipating heat generated by the high power chip in a fcBGA package, a wbBGA package, a 2.5D/3D TSV package, a PoP, etc.

Figure 1A:
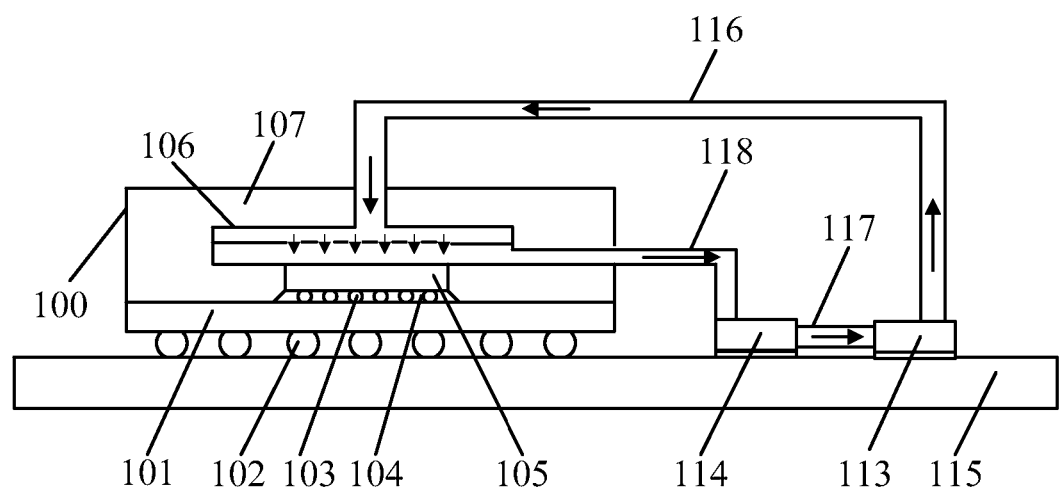
FIGS. 1A-1C illustrate a heat dissipation structure for a fcBGA package in accordance with an embodiment of the invention. The fcBGA with a built-in micro-jet is assembled on the same PCB as a micro-pump and a heat exchanger. The micro-jet is attached to the top surface of a high power chip by a thermal interface material ("TIM") with high thermal conductivity.
Figure 1B:
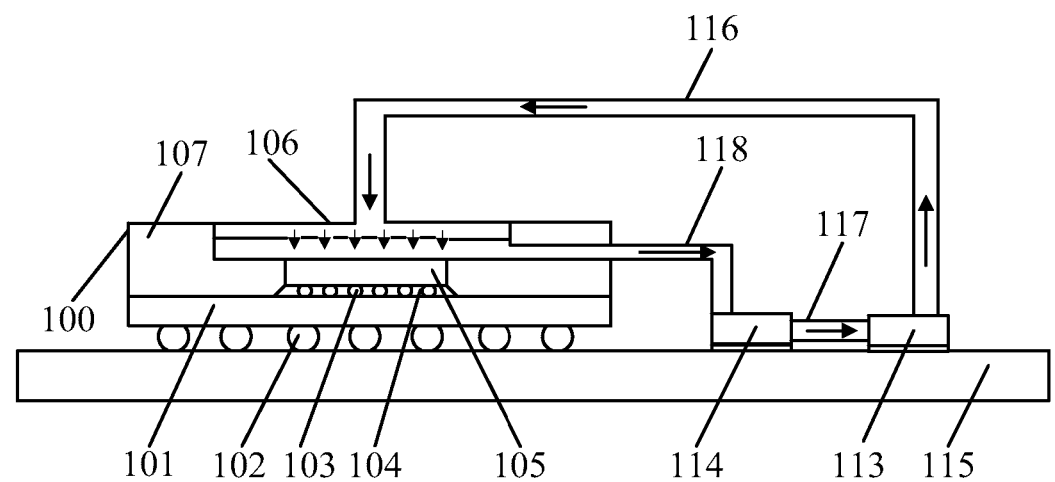
Figure 1C:
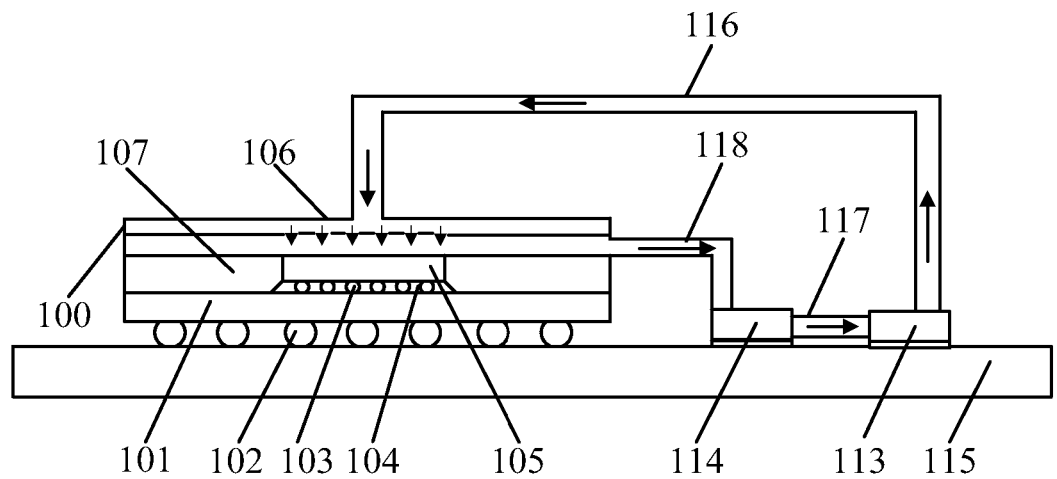

Referring to FIGS. 1A, 1B and 1C, a high power chip package, e.g., a fcBGA package 100 with a built-in micro-jet 106, may be soldered onto a PCB 115 with solder BGA 102. A micro-pump 113 and a heat exchanger 114 may be assembled on the same PCB 115 as the fcBGA 100. Micro-pump 113 can drive the coolant. The heat exchanger 114 may be an external heat sink, and may have a heat base and fins. The heat sink may be, e.g., a plate-fin heat sink, an in-line fin heat sink, or a staggered fin heat sink. The fcBGA package 100 includes a high power flip chip 105 soldered onto an organic substrate 101 with a solder bump 103. To enhance the solder bump joint reliability, underfill 104 is injected between the chip 105 and the organic substrate 101. The micro-jet 106 may be connected to the top surface of the high power chip 105. For example, the micro-jet 106 may be attached to the chip by a thermal interface material ("TIM") with high thermal conductivity. An inlet 110 of the micro-jet 106 may be connected to a micro-pump 113 through pipe 116. An outlet 111 of micro-jet 106 may be connected to a heat exchanger 114 through pipe 118. The micro-pump 113 may be connected to the heat exchanger 114 through pipe 117. Each of the pipes 116, 117, 118 may be a plastic or a rubber hose.

Referring to FIG. 1A, high power chip package may include mold compound 107 encapsulating the high power chip 105, and the micro-jet 106 may be covered by mold compound 107. The mold compound 107 may include epoxy resin, hardener, filler, flame retardant, etc., having a thickness of, e.g., 0.37 mm, 0.53 mm, 0.6 mm, etc., depending on the thickness of high power chip 105 and micro jet 106. Referring to FIGS. 1B and 1C, alternatively, at least a portion of the surface of the micro jet 106, e.g., the top surface of the micro jet 106, may be exposed on the top side of the fcBGA 100, with mold compound 107 surrounding the sides of the micro-jet 106.

Figure 2:
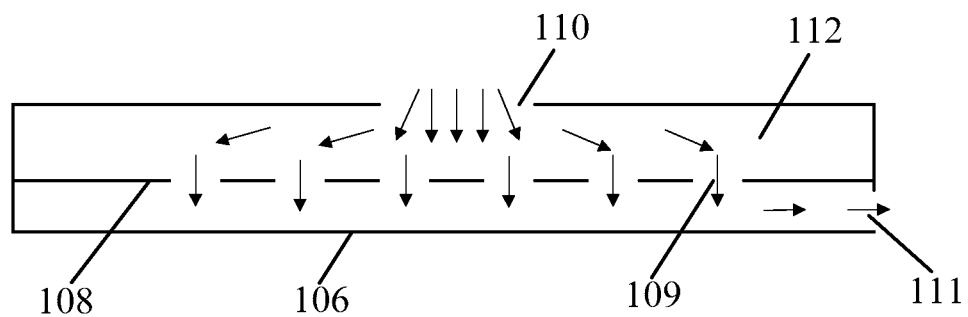
FIG. 2 is a cross-sectional view of the micro jet in the fcBGA package, in accordance with an embodiment of the invention.
Figure 3:
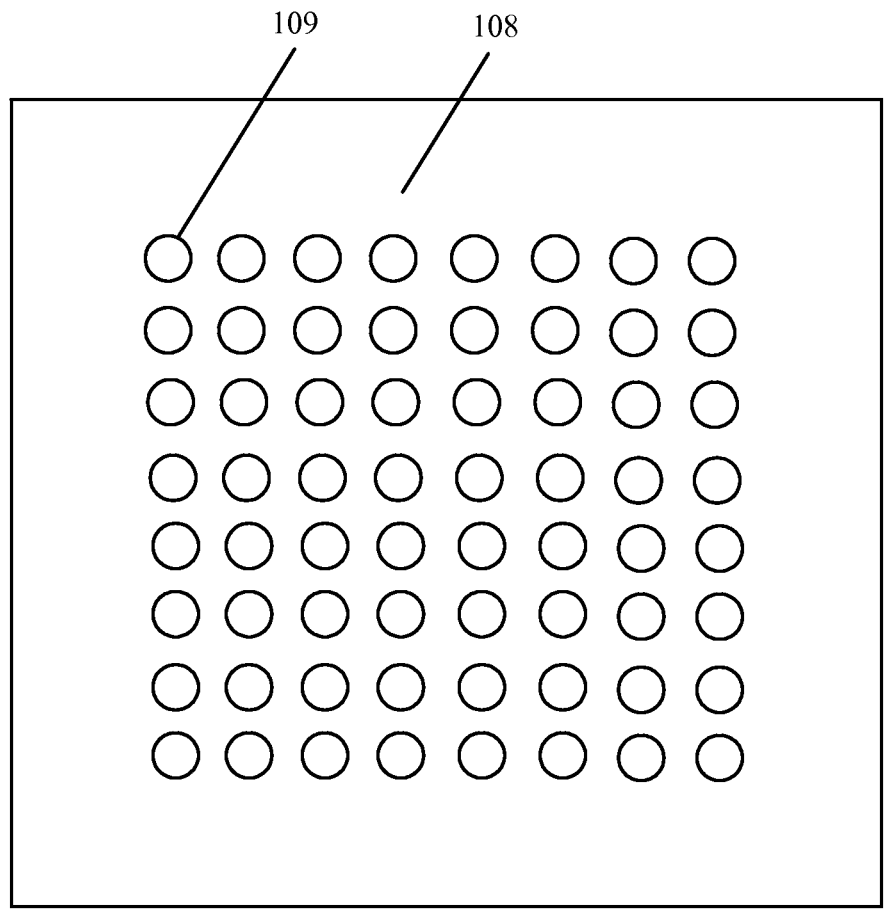
FIG. 3 illustrates a separator of the micro jet in the fcBGA package, with an array of via holes in the separator, in accordance with an embodiment of the invention.

Referring to FIG. 2 and FIG. 3, the inlet 110 may be defined in the top wall of the micro jet 106, the outlet 111 in a side wall of the micro-jet 106, and a separator 108 in the middle of a micro jet chamber 112. The separator 108 may be made from, e.g., copper, and may define an array of via holes 109. The via holes 109 may have diameters of about 50 µm. The via holes 109 array may be arranged in accordance with the heat flux or heat spots of high power chip 105. For example, the vias may define 8×8, 10×10, 20×20 arrays, as shown in FIG. 3. The micro jet 106 is preferably made from a rigid non-reactive material, such as copper. The inlet 110 and outlet 111 may both be cylindrical holes, sized such that the pipes 116, 118 can be inserted into the inlet 110 and outlet 111, respectively.

During operation, in the heat dissipation structure, deionized water or liquid metal may be used as a micro jet coolant. Suitable liquid metals include gallium and its alloys, for their advantageous properties of low melting points, high thermal conductivity, non-flammable and non-toxic activities, low vapor pressure, high boiling point, etc. The coolant may be introduced into the micro-jet chamber 112 through the inlet 110 by the driving force of micro-pump 113. The micro-jet chamber 112 may include the separator 108, to help ensure temperature uniformity of the high power chip 105, avoid creation of a local hotspot, and increase the reliability of high power chip 105. The via holes 109 defined by the separator 108 may be cylindrical.

The coolant may spray on the internal wall of micro-jet 106 through via holes array on the separator 108, and absorb the heat generated by high power chip 105. Subsequently, the coolant may flow to the heat exchanger 114 through the outlet 111, and transfer the heat to the ambient through the heat exchanger 114. Then, induced by the driving force of the micro-pump 113, the coolant may flow back to the micro-jet 106.

Figure 4:
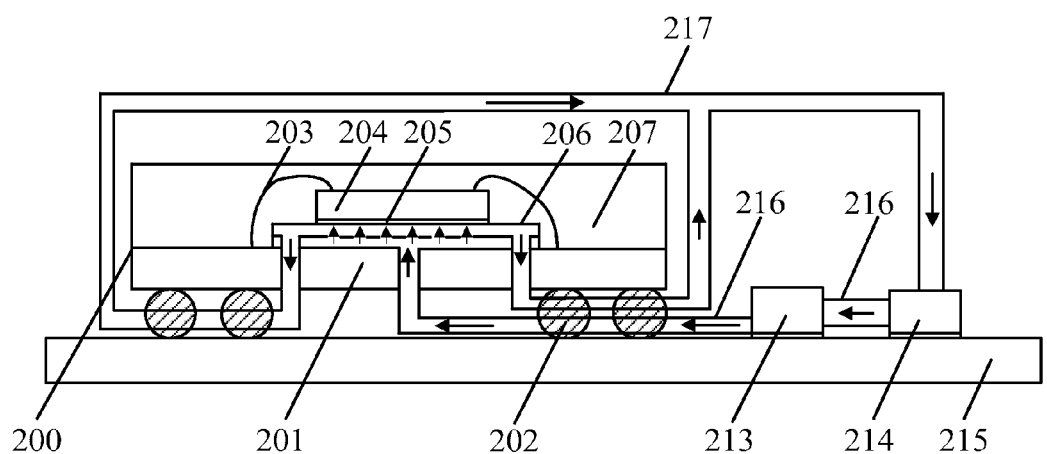
FIG. 4 illustrates a heat dissipation structure for a wbBGA package, in accordance with an embodiment of the invention. The wbBGA package with a built-in micro jet is assembled on the same PCB with a micro-pump and a heat exchanger.

Referring to FIG. 4, a high power chip package, e.g., a wbBGA package 200 with a built-in micro-jet 206, may be soldered onto a PCB 215 with solder BGA 202. A micro-pump 213 and a heat exchanger 214 may be assembled on the same PCB 215 as the wbBGA 200. The micro-jet 206 may be assembled on an organic substrate 201. The inlet 210 of the micro-jet 206 may be connected to a micro-pump 213 by pipe 216. The two outlets 211 of the micro-jet 206 may be connected to a heat exchanger 214 by pipe 217. The micro-pump 213 may be connected to the heat exchanger 214 by pipe 216. A high power chip 204 may be attached to the micro-jet 206 by die attach 205. The die attach 205 may be a high thermal conductivity material, such as a diamond film. The high power chip 204 may be wire-bonded to the organic substrate 201 by, e.g., at least one metal wire, such as a gold or copper wire 203. The chip 204 may be encapsulated by mold compound 207.

Figure 5:
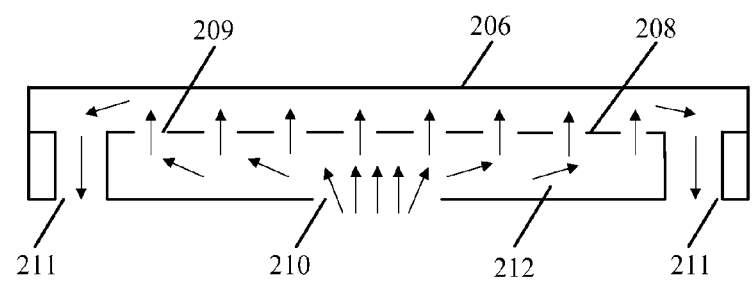
FIG. 5 is a cross sectional view of the micro jet in the wbBGA package.
Figure 6:
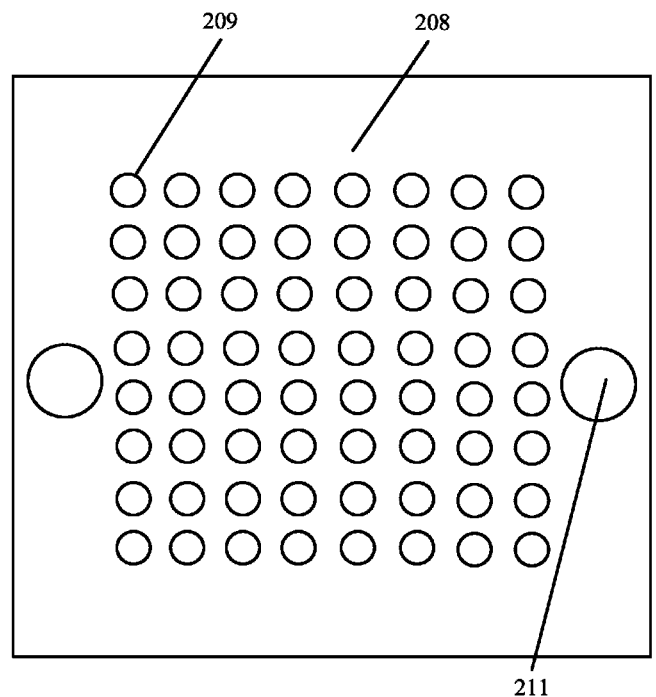
FIG. 6 illustrates a separator of the micro-jet in the wbBGA package, with an array of via holes defined in the separator.

Referring to FIG. 5 and FIG. 6, the bottom wall of the micro-jet 206 may define an inlet 210 and two outlets 211. A separator 208 may be disposed in the middle of micro-jet chamber 212. An array of via holes 209 may be defined in the separator 208.

During operation, in the heat dissipation structure, deionized water or liquid metal (e.g., gallium and its alloys) may be used as a micro-jet coolant. The coolant may be introduced into the micro-jet chamber 212 through the inlet 210 by the driving force of micro-pump 213. The micro-jet chamber 212 may contain the separator 208 to ensure the temperature uniformity of the high power chip 204, avoid the local hotspot, and increase the reliability of the high power chip 204.

The coolant may spray on the internal wall of micro-jet 206 through via holes array on the separator 208, and absorb the heat generated by high power chip 204. Subsequently, the coolant may flow to the heat exchanger 214 through the outlet 211, and transfer the heat to the ambient through heat exchanger 214. Then, induced by the driving force of the micro-pump 213, the coolant may flow back to the micro-jet 206.

Figure 7A:
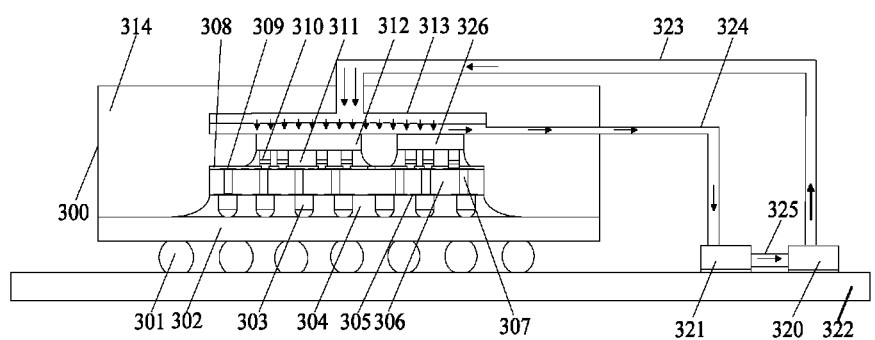
FIGS. 7A-7C illustrate a heat dissipation structure for a 2.5D/3D TSV package. The 2.5D/3D TSV package with a built-in micro jet is assembled on the same PCB with a micro-pump and a heat exchanger. The micro jet is attached to the top surface of the high power chip by a TIM with high thermal conductivity.
Figure 7B:
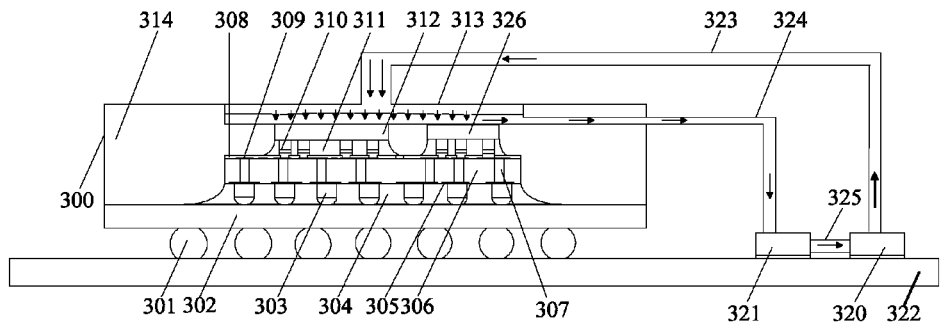
Figure 7C:
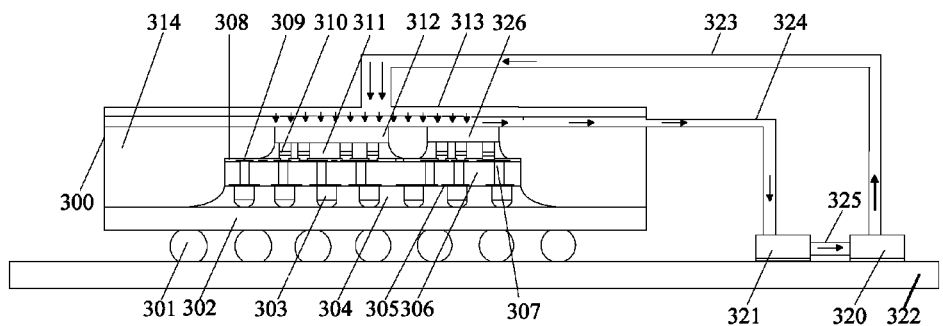

Referring to FIGS. 7A, 7B, and 7C, a high power chip package, e.g., a 2.5D/3D TSV package 300 with a built-in micro-jet 313, may be soldered onto a PCB 322 with solder BGA 301. A micro-pump 320 and a heat exchanger 321 may be assembled on the same PCB 322 with the 2.5D/3D TSV package 300.

Layer 306 may be an interposer or an active chip. In general, an interposer 306 is a stress buffer used to connect chips disposed on the interposer or to redistribute the bumps of the chips.

In embodiments in which layer 306 is an interposer, the TSV package 300 may be a 2.5D TSV package. If layer 306 is an active chip, the TSV package 300 may be a 3D package. Many TSVs 307 may be disposed in the interposer or active chip 306.

The interposer or active chip 306 may include a back redistribution layer ("RDL") 305 and a front RDL 309.

An insulator layer 308 may be formed on the front RDL layer 309.

High power chips 312 and 326 may be soldered onto the interposer or active chip 306 with micro-bump 310. The high power chip 312 may be a logic chip, and the high power chip 326 may be a memory chip. An upper underfill layer 311 may be used to fill gaps between the high power chip 312 and the interposer or active chip 306. An upper underfill layer 311 may also be used to fill gaps between the high power chip 326 and the interposer or active chip 306. The interposer or active chip 306 may be soldered onto the organic substrate 302 with copper pillar bump 303. A lower underfill layer 304 may be used to fill gaps between the organic substrate 302 and the interposer or active chip 306.

The micro-jet 313 may be attached to top surfaces of the high power chips 312 and 326 by TIMs with high thermal conductivity. An inlet 318 of the micro-jet 313 may be connected with a micro-pump 320 through pipe 323. An outlet 317 of the micro jet 313 may be connected with a heat exchanger 321 by pipe 324. The micro-pump 320 may be connected with the heat exchanger 321 by pipe 325. The micro-jet 313 may be covered by mold compound 314. Alternatively, the top surfaces of the micro-jet 313 may be exposed on the outside of the 2.5D/3D TSV package 300.

Figure 8:
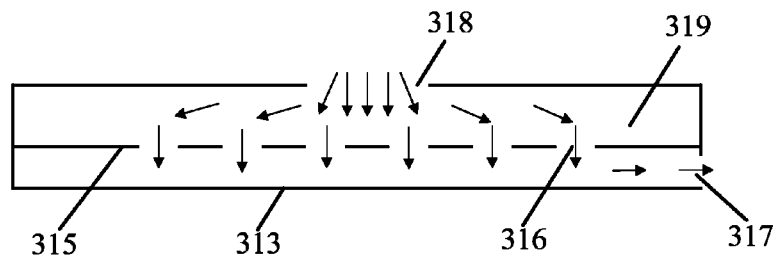
FIG. 8 is a cross sectional view of the micro jet in the 2.5D/3D TSV package.
Figure 9:
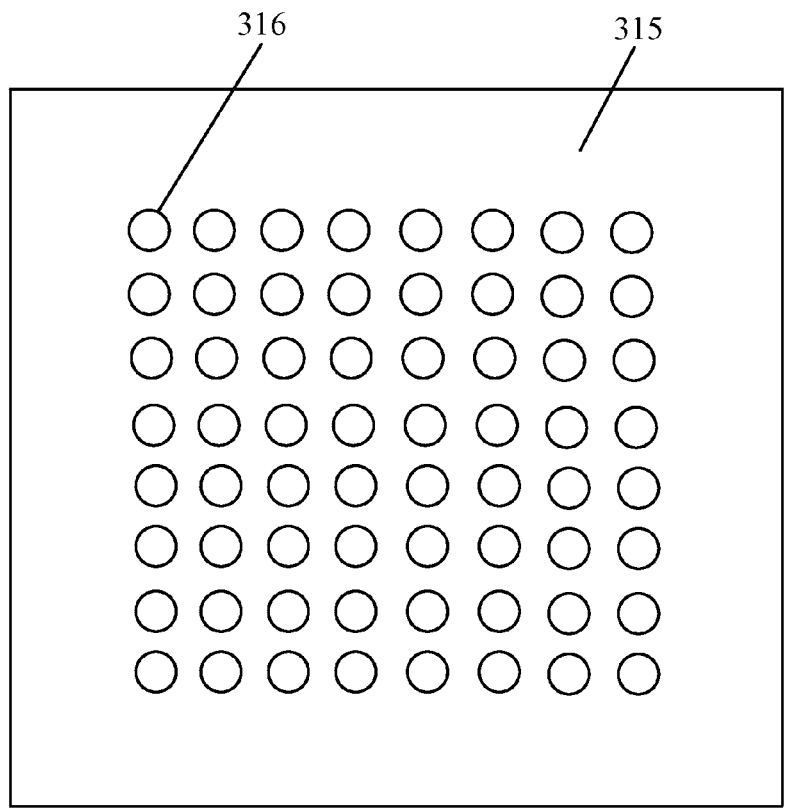
FIG. 9 illustrates a separator of the micro-jet in the 2.5D/3D TSV package, with an array of via holes defined in the separator.

Referring to FIG. 8 and FIG. 9, in some embodiments, the inlet 318 is defined in the top wall of the micro-jet 313, and the outlet 317 in a side wall of the micro-jet 313. A separator 315 may be disposed in the middle of micro jet chamber 319. An array of via holes 316 are defined in the separator 315.

During operation, deionized water or liquid metal (e.g., gallium and its alloys) may be used as a micro-jet coolant. The coolant may be introduced into the micro-jet chamber 319 through the inlet 318 by the driving force of micro-pump 320. To ensure the temperature uniformity of the high power chips 312 and 326, avoid creation of a local hotspot, and raise the reliability of high power chips 312 and 326, micro jet 313 may contain a separator 315. The separator 315 may define an array of via holes 316.

The coolant may spray on the wall of micro jet 313 through the separator 315, and absorb the heat generated by the high power chips 312 and 326. Subsequently, the coolant may flow to the heat exchanger 321 through the outlet 317, and transfer the heat to the ambient through heat exchanger 321. Then, induced by the driving force of the micro-pump 320, the coolant may flow back to the micro-jet 313.

Figure 10:
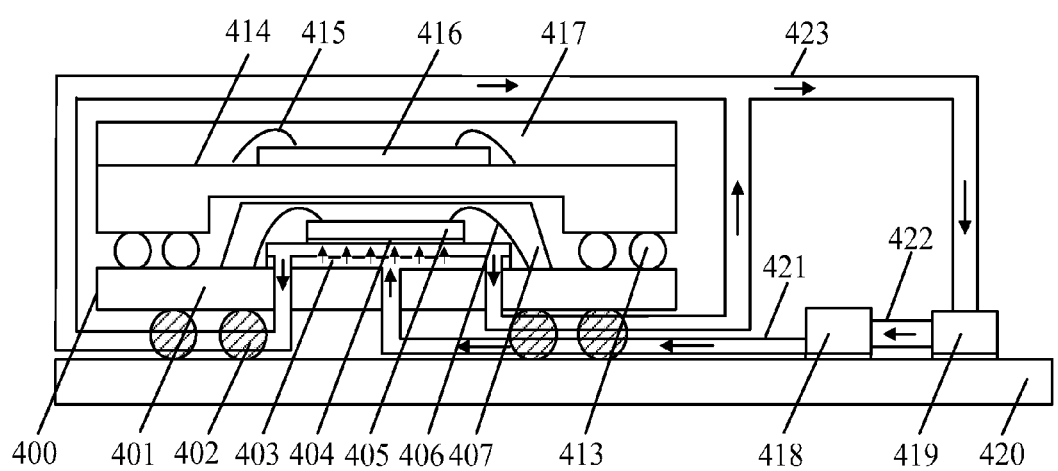
FIG. 10 illustrates a heat dissipation structure for a PoP. The PoP with a built-in micro jet is assembled on the same PCB with a micro-pump and a heat exchanger.

Referring to FIG. 10, a high power chip package, e.g., a PoP with a built-in micro jet 403 in a bottom package 400 thereof, may be soldered onto a PCB 420 with solder BGA 402. A micro-pump 418 and a heat exchanger 419 may be assembled on the same PCB 420 with the PoP. The micro jet 403 may be assembled on an organic substrate 401.

An inlet 410 of the micro jet 403 may be connected with a micro-pump 418 by pipe 421. Two outlets 411 of the micro jet 403 may be connected with a heat exchanger 419 through pipe 423. The micro-pump 418 may be connected with the heat exchanger 419 by pipe 422. The high power chip 405 is attached to the micro jet 403 through die attach 404. The die attach 404 may be a high thermal conductivity material, such as a diamond film. The high power chip 405 may be wire-bonded to the organic substrate 401 with, e.g., metal, such as gold or copper wire 406. The chip may be encased by mold compound 407.

The top package of the PoP may be connected to the bottom package with BGA support ball 413. A memory chip 416 may be wire-bonded to an organic substrate 414 with, e.g., metal, such as gold or copper wire 415. Mold compound 417 may encase the memory chip 416.

Figure 11:
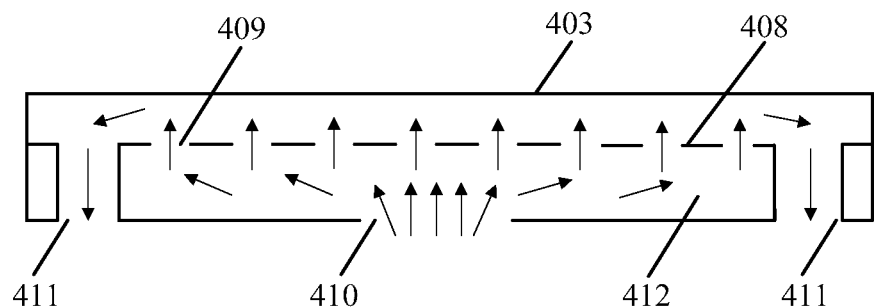
FIG. 11 is a cross sectional view of the micro jet in the bottom package of a PoP.
Figure 12:
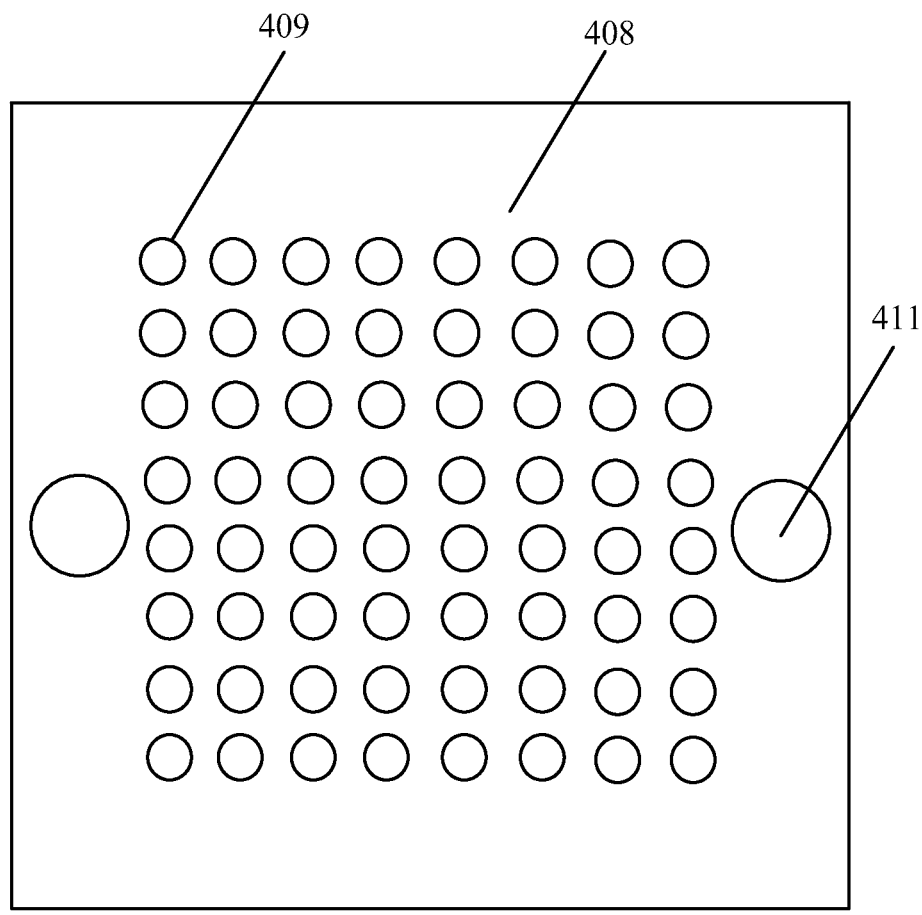
FIG. 12 illustrates a separator of the micro jet in the bottom package of a PoP, with an array of via holes defined in the separator.

Referring to FIG. 11 and FIG. 12, the inlet 410 may be defined in the bottom wall of the micro jet 403, and two outlets 411 may be defined in the bottom wall of the micro-jet 403. A separator 408 may be disposed in the middle of micro jet chamber 412. The separator 408 may define several via holes 409.

During operation, deionized water or liquid metal (e.g., gallium and its alloys) may be used as a micro-jet coolant. The coolant may be introduced into the micro-jet chamber 412 through the inlet 410 by the driving force of micro-pump 418. To ensure the temperature uniformity of the high power chip 405, avoid creating a local hotspot, and raise the reliability of high power chip 405, micro-jet chamber 403 may contain the separator 408.

The coolant sprays on the wall of micro-jet cavity 412 through via holes array on the separator 408, and absorbs heat generated by the high power chip 405. Subsequently, the coolant flows to the heat exchanger 419 through the outlet 411, and transfers the heat to the ambient through heat exchanger 419. Then, induced by the driving force of the micro-pump 418, the coolant flows back to the micro jet 403.

Those skilled in the art will readily appreciate that all parameters listed herein are meant to be exemplary and actual parameters depend upon the specific application for which the methods and materials of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A heat dissipation system for a high power chip package, comprising:
   a high power chip having a heat flux of over 350 W/cm$^2$ or having hot spots of more than 10 kW/cm$^2$;
   a built-in micro-jet disposed in the high power chip package and attached to the high power chip, the built-in micro-jet having a micro-jet chamber defined by a top wall, a bottom wall, and at least one sidewall, and a separator disposed in a middle of the micro-jet chamber dividing the micro-jet chamber into an upper chamber and a lower chamber, the bottom wall of the built-in micro-jet is attached to a surface of the high power chip by one selected from a group of a direct attachment of the bottom wall of the built-in micro-jet to the surface of the high power chip and a die attach material disposed between the high power chip and the bottom wall of the built-in micro-jet;
   a plurality of via holes disposed in the separator, wherein the plurality of via holes is arranged in an array;
   a mold compound encapsulating the high power chip and contacting at least a portion of the built-in micro-jet;
   a pump in fluidic communication with the built-in micro-jet;
   a heat exchanger in fluidic communication with the pump; and
   a coolant flowing through the built-in micro-jet, the pump, and the heat exchanger.

2. The heat dissipation system of claim 1, wherein the high power chip package is selected from a group consisting of a fcBGA package, a wbBGA package, a 2.5D/3D TSV package, and a PoP.

3. The heat dissipation system of claim 1, further comprising an inlet of the micro-jet chamber and an outlet of the micro jet chamber.

4. The heat dissipation system of claim 3, wherein the coolant flows from the pump through the inlet of the micro-jet chamber into the upper chamber of the micro-jet chamber.

5. The heat dissipation system of claim 3, wherein the coolant flows from the lower chamber of the micro-jet chamber through the outlet of the micro-jet chamber to the heat exchanger.

6. The heat dissipation system of claim 1, wherein the high power chip package, the pump, and the heat exchanger are disposed on a single PCB.

7. The heat dissipation system of claim 1, wherein the mold compound encapsulates the built-in micro-jet.

8. The heat dissipation system of claim 1, wherein at least a portion of a surface of the built-in micro-jet is exposed by the mold compound.

9. The heat dissipation system of claim 1, wherein the high power chip is disposed on an organic substrate of the high power chip package.

10. The heat dissipation system of claim 1, wherein the coolant absorbs heat generated by the high power chip through one selected from the group of the direct attachment bottom wall of the micro-jet chamber to the surface of the high power chip and the die attach material disposed between the high power chip and the bottom wall of the built-in micro-jet.

11. The heat dissipation system of claim 1, wherein the plurality of via holes disposed in the separator of the micro-jet chamber are configured to distribute the coolant evenly on the portion of the micro-jet chamber contacting the surface of the high power chip.

12. The heat dissipation system of claim 1, wherein the array of via holes is selected from a group of an 8×8 array, a 10×10 array, and a 20×20 array.

13. The heat dissipation system of claim 1, wherein the plurality of via holes are cylindrical, and wherein a diameter of each of the plurality of via holes is 50 micrometers.

14. The heat dissipation system of claim 1, wherein the separator is copper.

* * * * *